US005675247A

United States Patent [19]

Miller et al.

[11] Patent Number: 5,675,247

[45] Date of Patent: Oct. 7, 1997

[54] DUAL HEAD ARMATURE PROCESSING METHOD AND APPARATUS

[75] Inventors: Ronald E. Miller; Robert C. Storar, both of Dayton, Ohio

[73] Assignee: Automation Technology, Inc., Dayton, Ohio

[21] Appl. No.: 513,207

[22] Filed: Aug. 10, 1995

[51] Int. Cl.⁶ .......................... G01R 31/26; G01R 31/34; B65G 47/86

[52] U.S. Cl. ................................... 324/158.1; 198/468.2; 324/772

[58] Field of Search ..................................... 324/545, 772, 324/158.1, 754, 765, 758; 198/346.2, 468.2; 414/222

[56] References Cited

U.S. PATENT DOCUMENTS

| | | | |
|---|---|---|---|
| 2,907,478 | 4/1959 | Von Zelewsky | 198/346.2 |
| 3,213,997 | 10/1965 | Fryer | 198/346.2 |
| 3,954,164 | 5/1976 | Bottomley | 198/418.4 |
| 4,690,050 | 9/1987 | Rouly et al. | 101/35 |
| 4,867,297 | 9/1989 | Saitoh et al. | 198/346.2 |
| 5,145,052 | 9/1992 | Santandrea et al. | 198/468.2 |
| 5,148,100 | 9/1992 | Sekiba | 324/765 |
| 5,257,698 | 11/1993 | Lombardi et al. | 198/346.2 |
| 5,330,043 | 7/1994 | Stuckey | 198/346.2 |

OTHER PUBLICATIONS

Automation Technology brochure entitled "Armature Test System ATS-700/3000 Series Automatic Test Sysstem".

Primary Examiner—Ernest F. Karlsen
Assistant Examiner—Anh Phung
Attorney, Agent, or Firm—Biebel & French

[57] ABSTRACT

A method and apparatus provides two testing stations at a single conveyor location to permits one part, such as electric motor armatures, to be tested while another part is being loaded or unloaded from a single conveyor system. Two testing heads are mounted on a reciprocating mechanism which allows the testing heads to be moved parallel to and independently of the conveyor system so that one or the other part may be aligned with a single loading and unloading station on the line at any given time. A part is first loaded into test station #1 and is then moved away from the loading station as testing station #2 is moved to it. When an electrical test on the part previously loaded into testing station #2 is finished, testing immediately begins on the part just loaded into test station #1. The part in testing station #2 is unloaded into the space vacated by the previous part, the conveyor is indexed, and the next part is loaded into testing station #2. This test station swapping operation is then reversed, and as soon as testing is complete in station #1, testing begins in station #2. The part in station #1 is unloaded, the conveyor is indexed, and the cycle is repeated. Since a part is always in a testing station waiting to be tested when testing of the previous part is finished, testing does not slow the indexing rate of the conveyor.

4 Claims, 16 Drawing Sheets

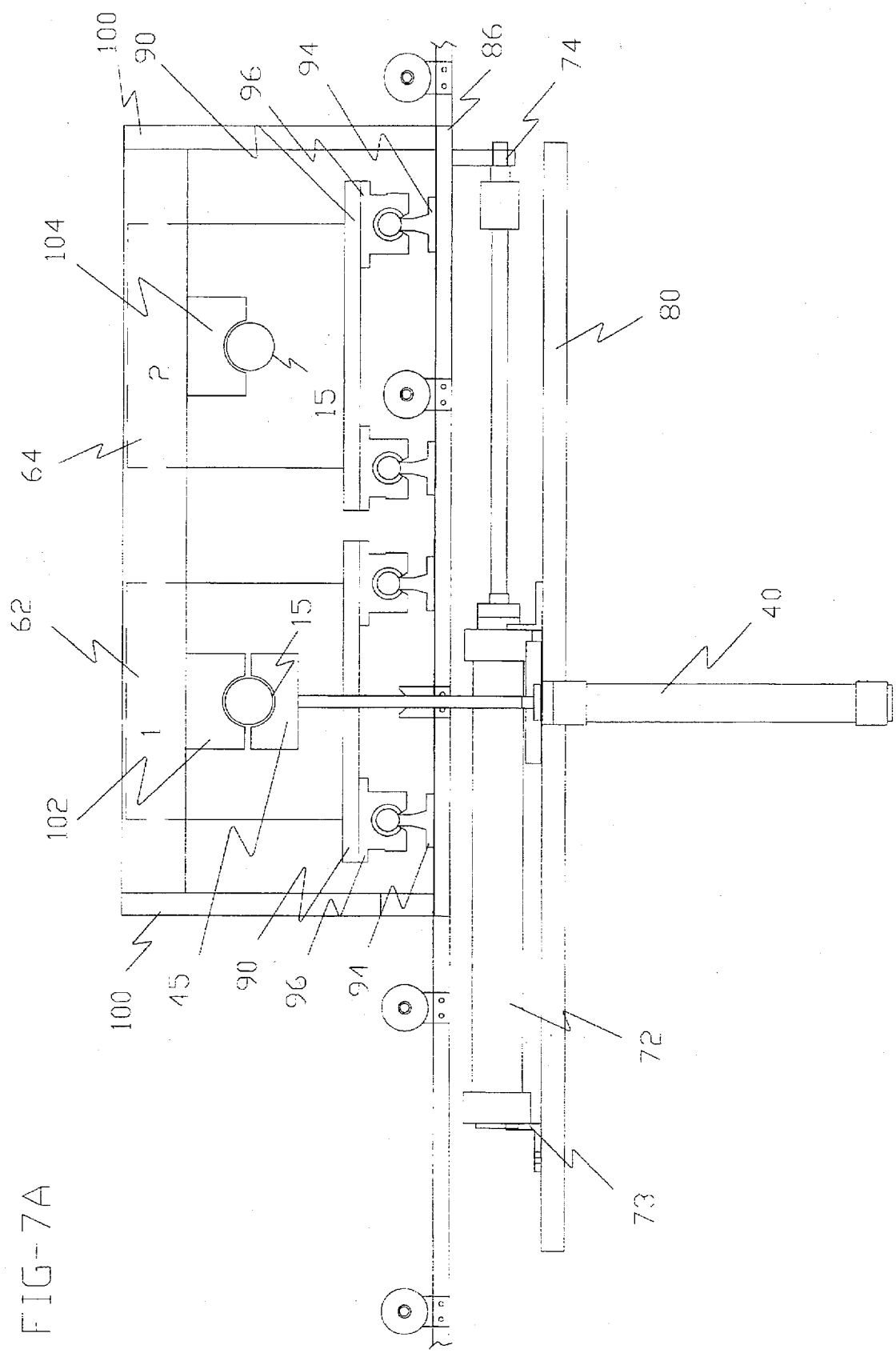

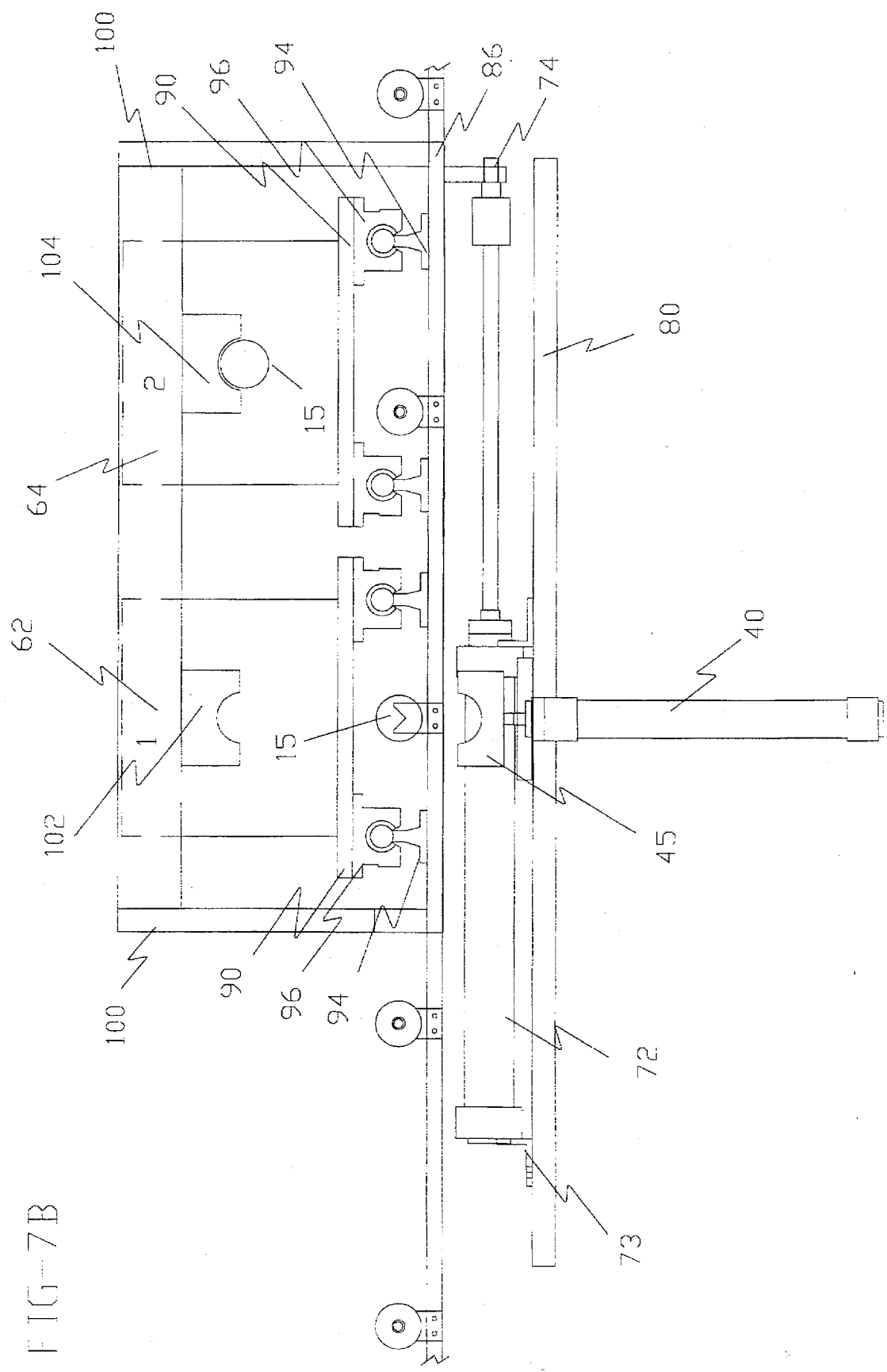

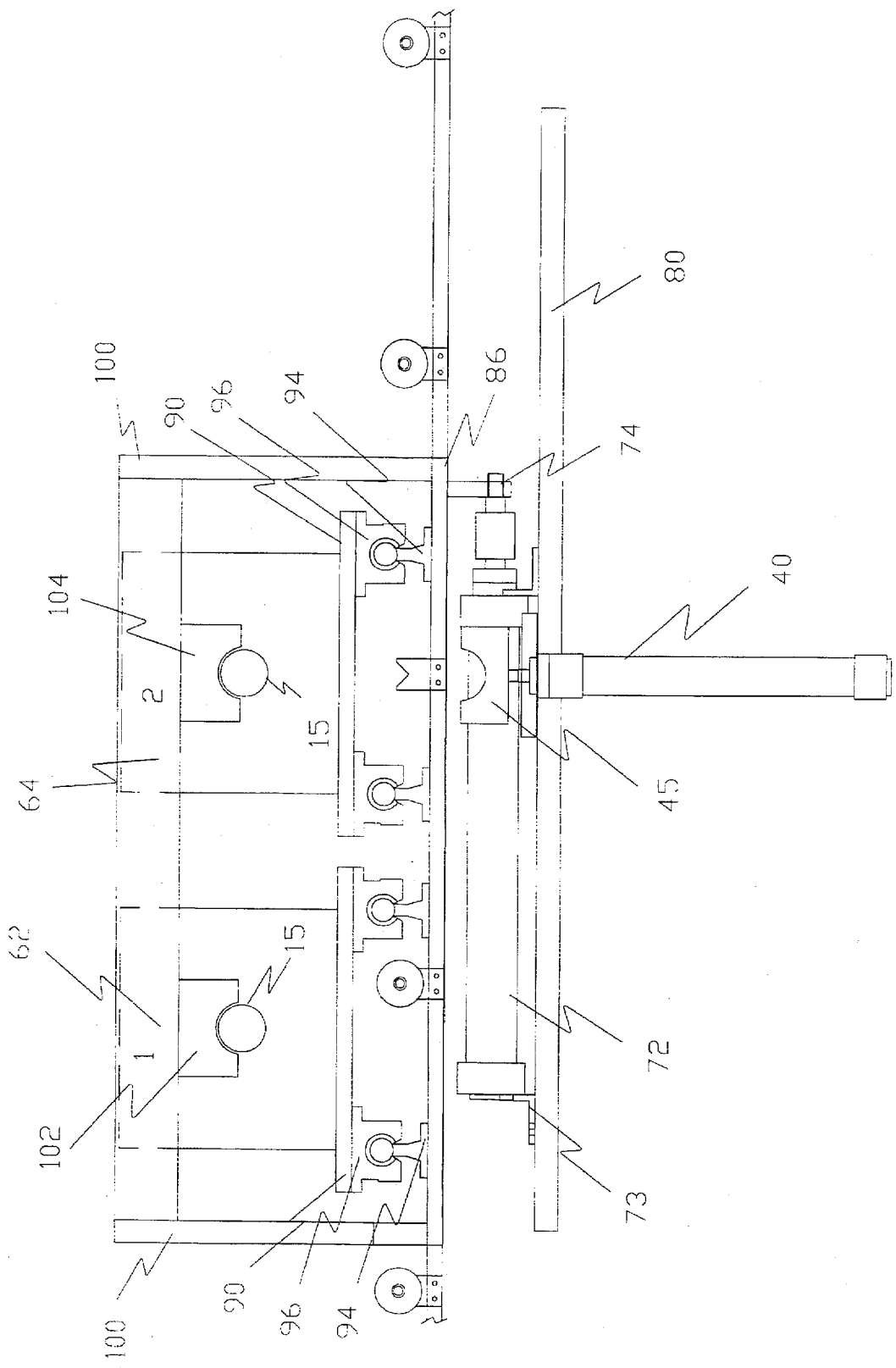

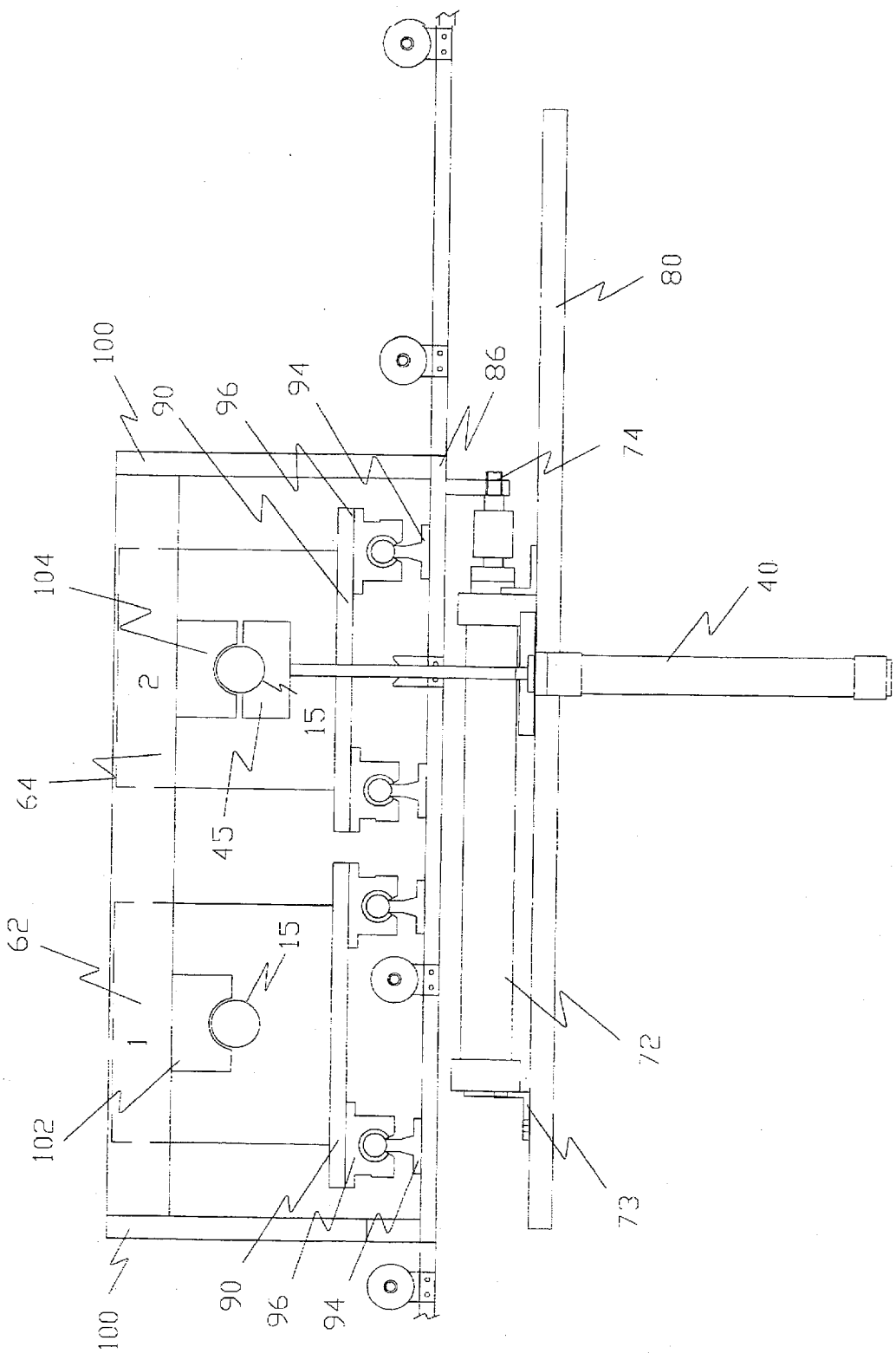

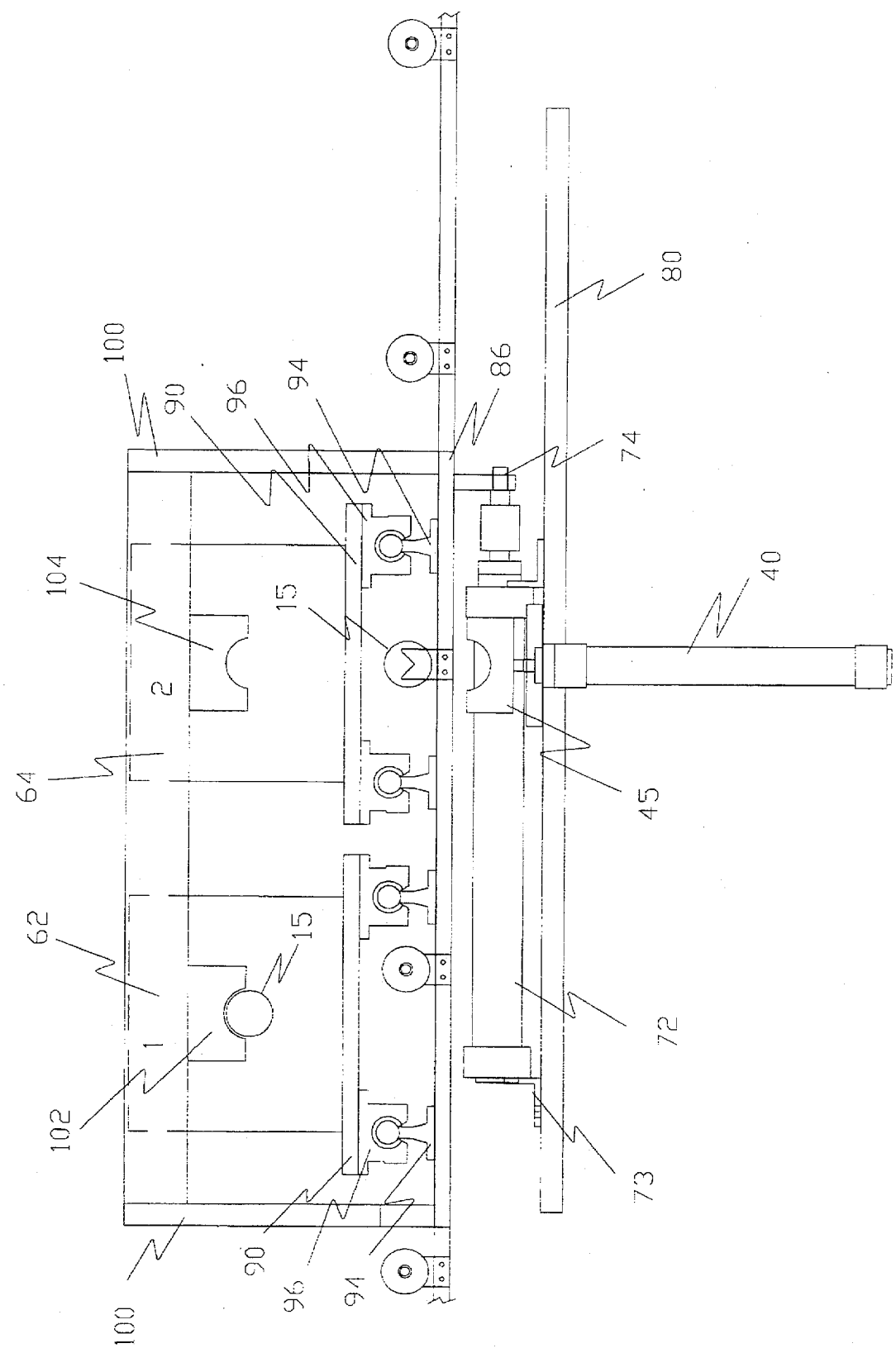

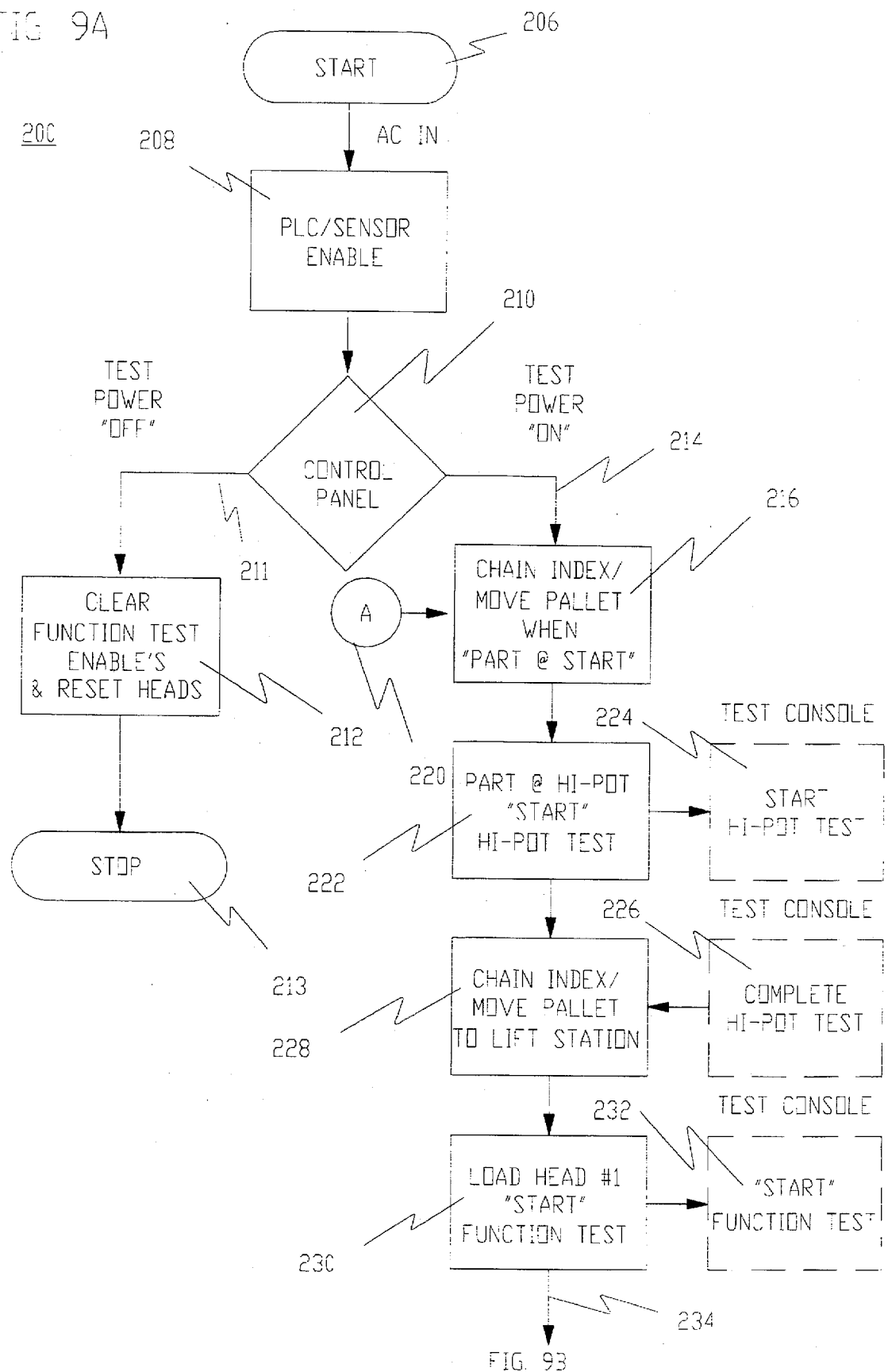

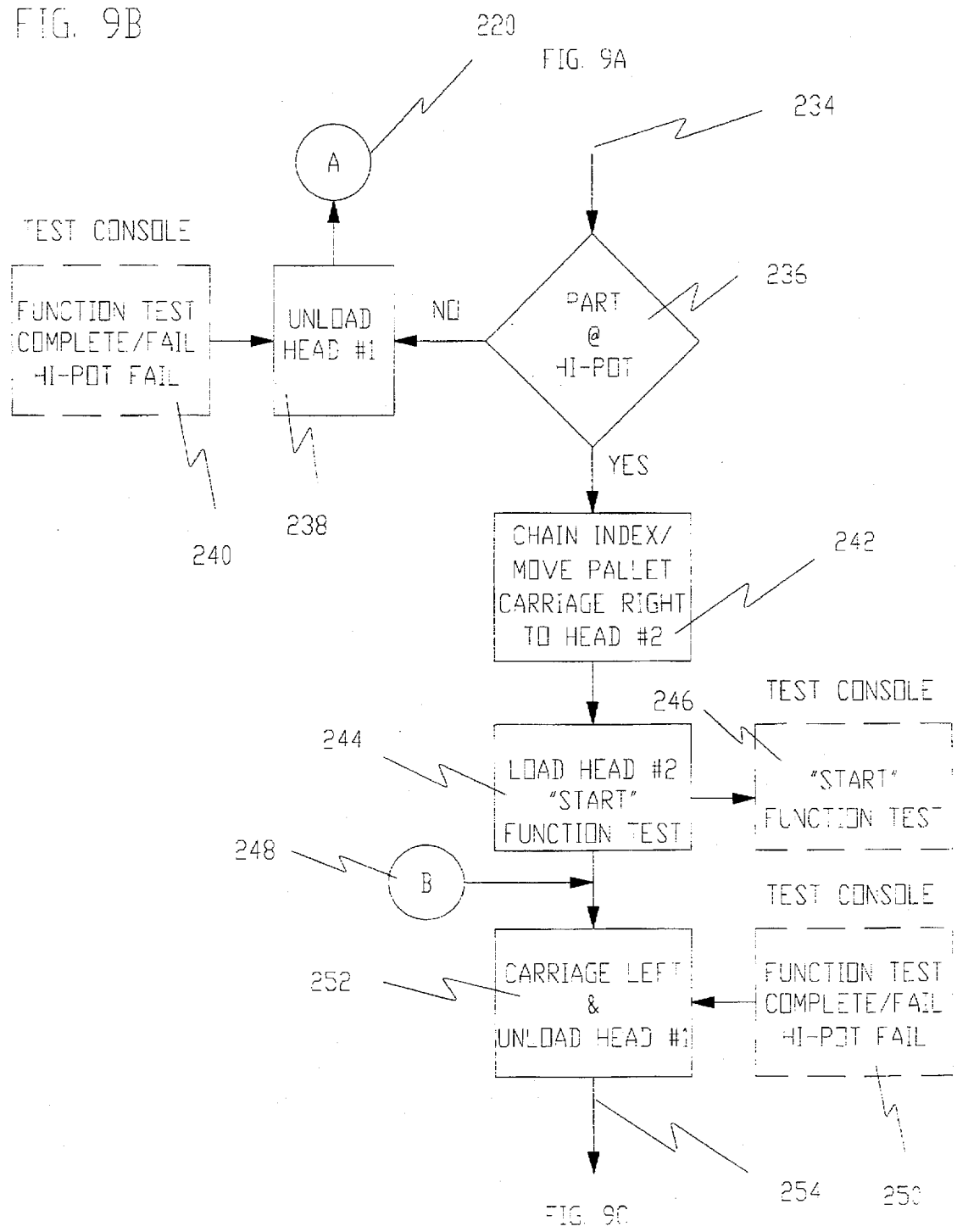

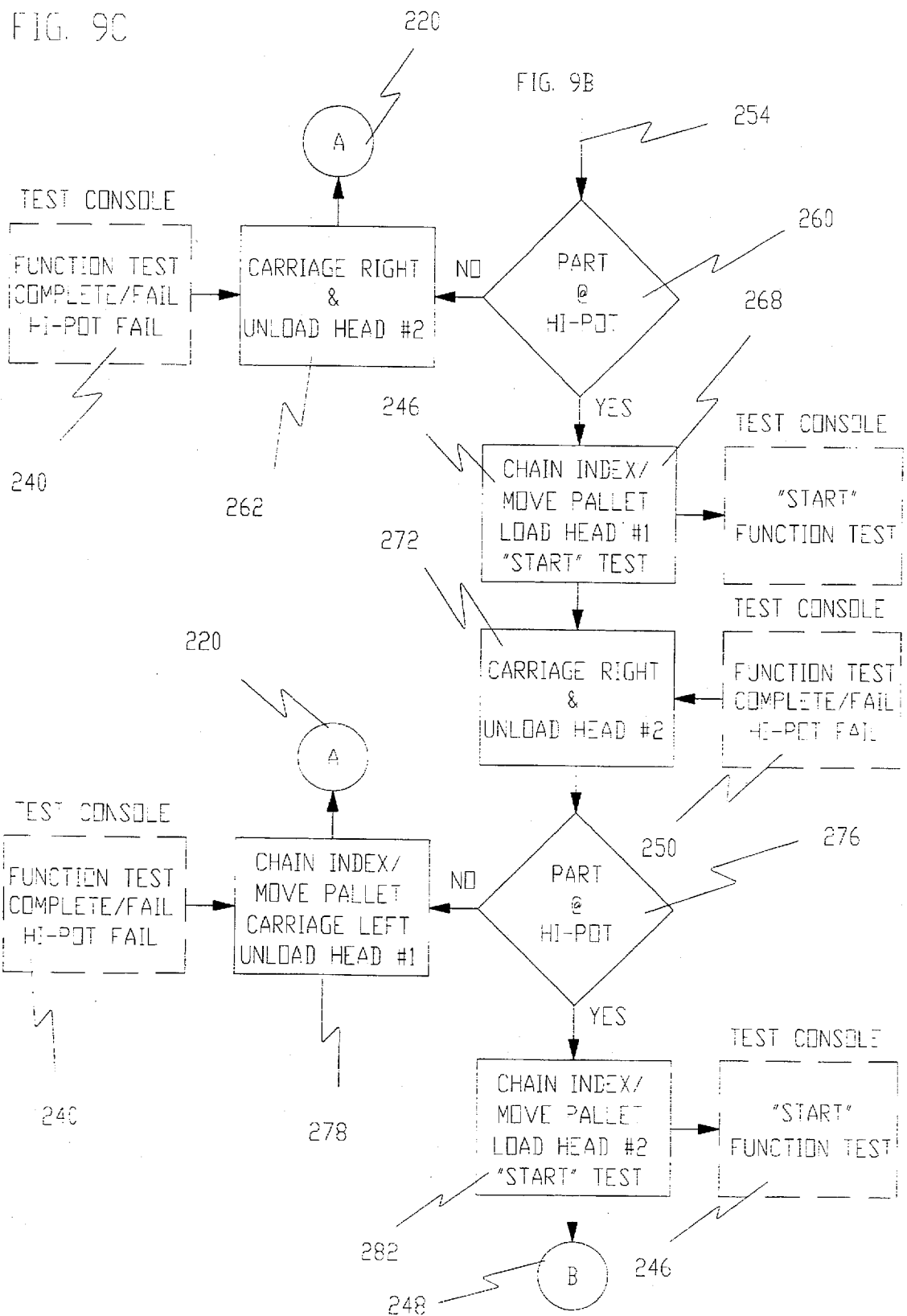

DUAL HEAD ARMATURE PROCESSING METHOD AND APPARATUS

BACKGROUND OF THE INVENTION

This invention relates to an improved method and apparatus for testing armatures and other components or parts at a single test station on a sequential conveyor system.

The historical method of testing armatures on an automated line involves a chain, walking beam, or conveyor system presenting one part at a time to a test station. The conveyor system for a typical motor armature manufacturing line moves the armatures in intervals of approximately four seconds. The tested part is first loaded into a nest or testing station where it is moved to a place to be tested, and then after testing, it is unloaded back to the conveyor. The conveyor is then moved or "indexed" to the next position placing the next part at the test station. The total cycle time for this type of system is therefore equal to the sum of the load time, the test time, the unload time, and the conveyor index time.

If the speed of conveyor is to be maintained, armature must be moved from the conveyor, tested and returned to the conveyor before the next indexing operation occurs. Because each of these steps consume a finite amount of time each, and since it would be desirable to provide as much time as possible for the testing operation, it would be desirable to reduce as much of the load and unload time from the total cycle time.

In one prior art system using dual testing stations, an operator can unload and load test fixture A while a test is being performed on a part previously loaded in test fixture B. In such a system, the load time and unload times are eliminated, subject to the human operator's ability to keep-up, so that total cycle time is equal to the test time.

The sequential nature of the conveyance systems used on automated lines limits the options one has for eliminating load and unload time in a similar manner. One approach might be to install two test stations on the line, one just ahead of the other. The process is to load the first part in testing station #1 and begin testing, load the second part in testing station #2 and begin testing it as soon as the first part is finished. The first part could then be unloaded followed by the second part when its test was finished. The line would then be indexed twice. Total cycle time for such a system would be one-half of the sum of the load time (part 1)+test time (part 1)+test time (part 2)+unload time (part 2) first index+second index time. This is a total cycle time improvement of one load and one unload operation per two parts. A problem is that on most installed conveyor lines, the next process will not accept a double index, rendering the scenario useless.

A second method which might come to mind is to split the conveyor line into two lines, one including test station A and the second including test station B, and then bring the lines together again prior to the next process. This method is undesirable due to the cost. Furthermore some of the time gained may be lost due to transferring the parts between conveyors.

SUMMARY OF THE INVENTION

This invention relates to a method and apparatus for eliminating load and unload times by providing two testing stations at one conveyor location. This unique arrangement permits one part to be tested while the other part is being loaded or unloaded from a single conveyor system having a single loading and unloading station.

In the present invention, the testing time of the component is not a limiting factor and does not slow the conveyor indexing rate on a simple sequential conveyor system. It involves two nests or testing heads mounted on a mechanism which allows the nests to be moved independently of the conveyor system so that one or the other may be aligned with a single loading and unloading station on the line at any given time.

In operation, a part is loaded into testing station #1 which is then moved away from the loading station as testing station #2 is moved to it. When the test on the part previously loaded into testing station #2 is finished, testing immediately begins on the part just loaded in testing station #1. The part in testing station #2 is unloaded into the space vacated by the previous part, the conveyor is indexed, and the next part is loaded into testing station #2. This nest-swapping operation is then reversed and as soon as testing is complete in testing station #1, testing begins in testing station #2. The part in testing station #1 is unloaded, the conveyor is indexed, and the cycle begins again. Since a part is always in a nest waiting to be tested when testing of the previous part is finished, the testing time is not a limiting factor in the speed or indexing rate of the conveyor.

It is therefore an object of this invention to provide an apparatus for electrically testing components as they move incrementally on a conveyor, said apparatus including a pair of testing stations movable in parallel with the movement of the conveyor, means for transferring a component between the conveyor and one of said testing stations, means for testing one component in one of said testing stations while another component is either being loaded into or removed from the other testing station, and means for moving said testing stations parallel to the direction of movement of the conveyor to permit a component to be loaded or unloaded.

It is a further object of this invention to provide a method for testing components as they move incrementally on a conveyor, said method including the steps of a. at a single conveyor location, transferring a component from the conveyor to one of a pair of testing stations that are movable relative to the single conveyor location, b. testing the component in one of said testing stations while the conveyor increments to its next position, c. moving the other of said testing station to a position above said single location, d. unloading a previously tested component from the other testing station, e. incrementing said conveyor by one step, f. loading an untested component into said other test station, and g. repeating steps b to f.

Other objects and advantages of the invention will be apparent from the following description, the accompanying drawings and the appended claims.

BRIEF DESCRIPTION OF THE DRAWINGS

FIGS. 7A through 7F are front elevational views of the invention at different times during a testing sequence;

FIGS. 9A, 9B and 9C together comprise a flow chart showing the sequence of operation of one embodiment of the present invention.

DESCRIPTION OF THE PREFERRED EMBODIMENT

Figure 1:
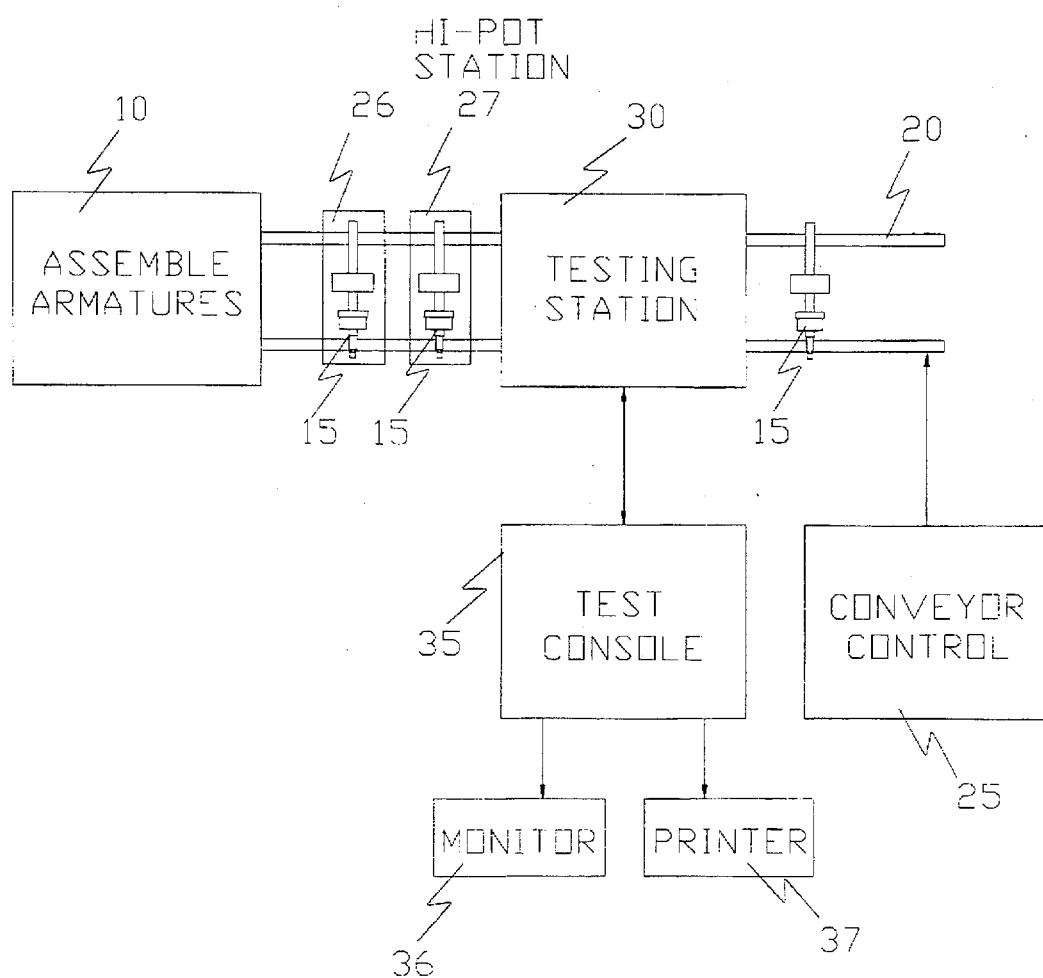
FIG. 1 is a simplified diagram showing some of the various components making up a typical armature manufacturing line.

Referring now to the drawings, which show a preferred embodiment of this invention, and particularly to FIG. 1, which is a simplified diagram showing some of the various components making up a typical armature manufacturing line, armatures to be tested are assembled at 10 and individual armatures 15 are carried by conveyor 20, which is moved incrementally under control of a conveyor control module 25, past stations 26 and 27, to a testing station 30 where the armatures are each removed temporarily from the conveyor. A test console 35 includes control circuits for controlling the operation of the testing stations and associated components. The results of the testing operation are displayed for each armature on monitor 36 and the results are recorded on printer 37. After testing, the armatures are replaced on the conveyor 20 and moved to a receiving location.

Figure 2:
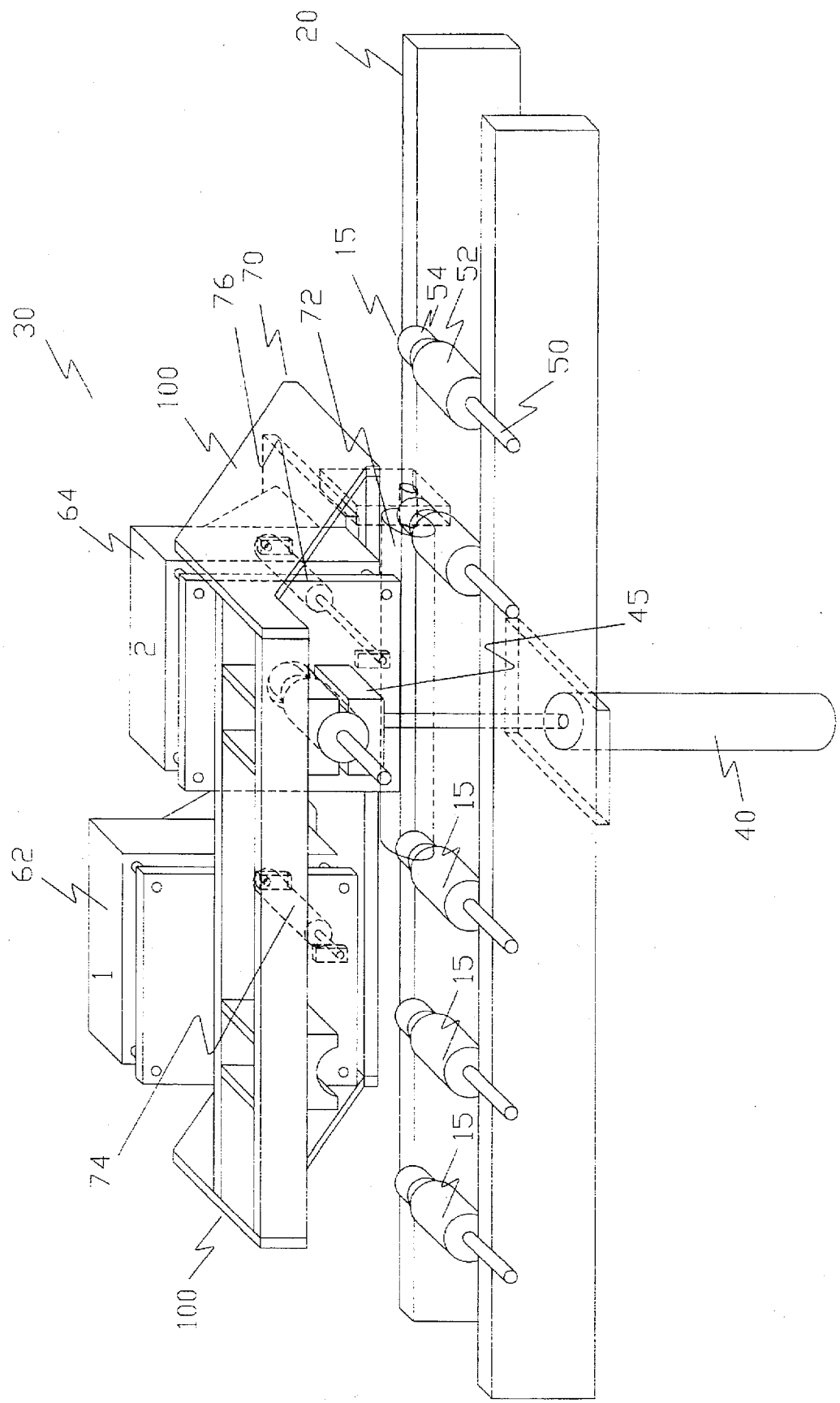
FIG. 2 is a perspective view of an armature test station constructed according to the present invention.

The testing station 30, shown generally in FIG. 2, includes means for transferring individual components, such as armatures, between the conveyor 20 and one of two testing stations. The component transferring mechanism includes a conventional lifting cylinder 40, which is provided with a suitable saddle 45 for engaging an armature and for holding the armature in the same position as it was on the conveyor as the armature is lifted from and eventually returned to the conveyor.

Each armature typically includes a shaft 50, a plurality of windings 52 and a commutator 54. The windings 52 are wound with insulated wire which terminate at individual commutator bars (not shown). During testing of an armature, the quality of the insulation and the resistance of the electrical connection between the wire and the commutator bars are tested. One example of an armature connection resistance tester is shown in U.S. Pat. No. 5,140,276.

Means are provided to test each component or armature, including the components of test station 30. The test station 30 includes a support frame 60 (FIG. 3) and a pair of nests or test heads 62 and 64, also referred to herein as Test Heads #1 and #2, respectively. Means are provided for moving the testing stations parallel to the direction of movement of the conveyor to permit each component or armature to be loaded or unloaded. A reciprocating mechanism 70, including a cross-travel cylinder 72, moves the Test Heads #1 and #2 in a direction parallel to the direction of movement of the conveyor, and therefore one or the other of the test heads may be positioned above the lift cylinder where that test head can receive and eject an armature. The test heads 62, 64 are also moved in a direction perpendicular to the direction of motion of the conveyor 20 by means of test head extend cylinders 74 and 76. When extended, the test head is positioned to test an armature. As shown in FIG. 2, Test Head #2 is above the armature lifting cylinder 40 and has engaged an armature.

Figure 3:
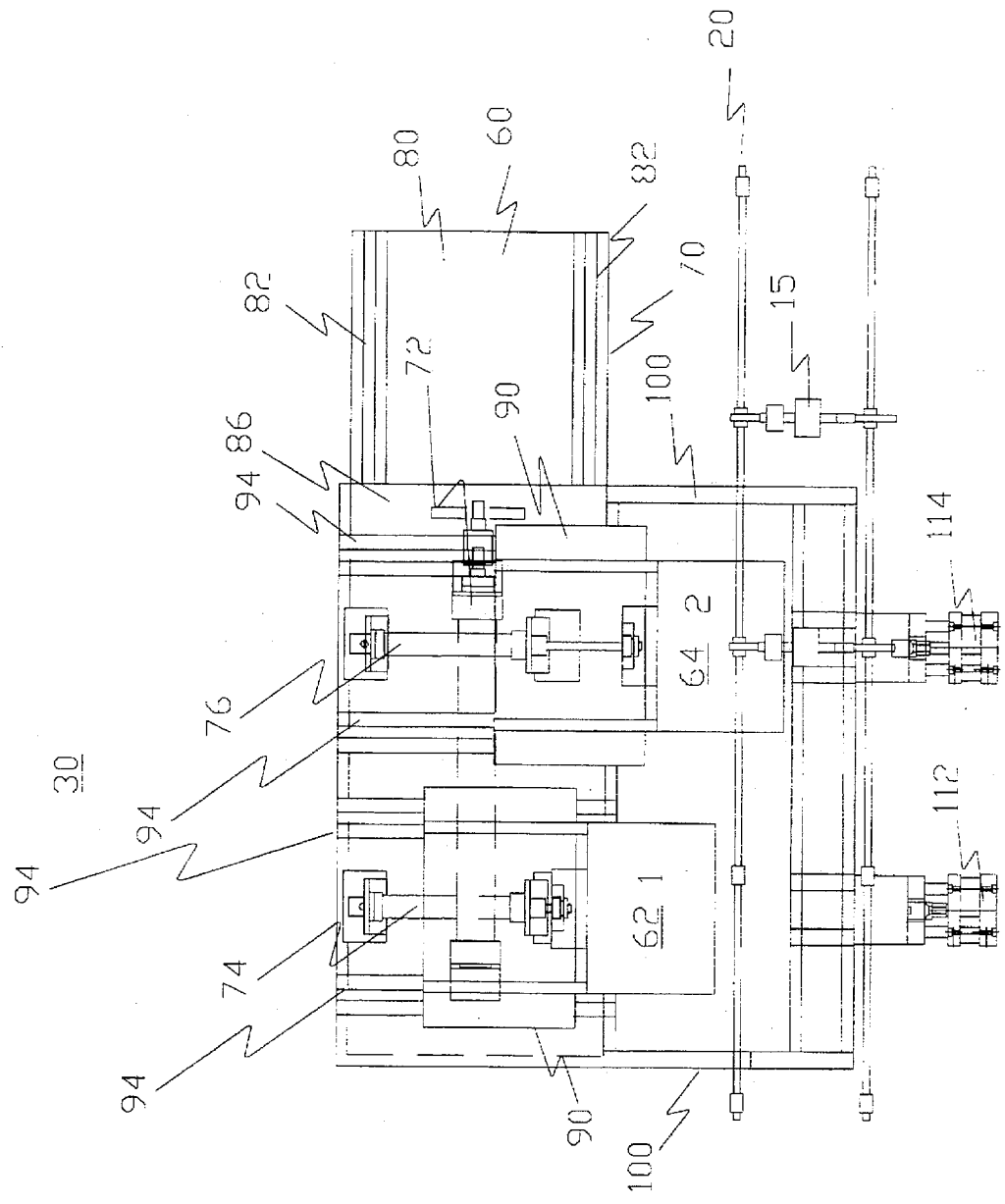
FIG. 3 is a plan view of a dual testing station, shown in the left-most position with Test Head #2 above the loading station and extended for testing an armature.
Figure 4:
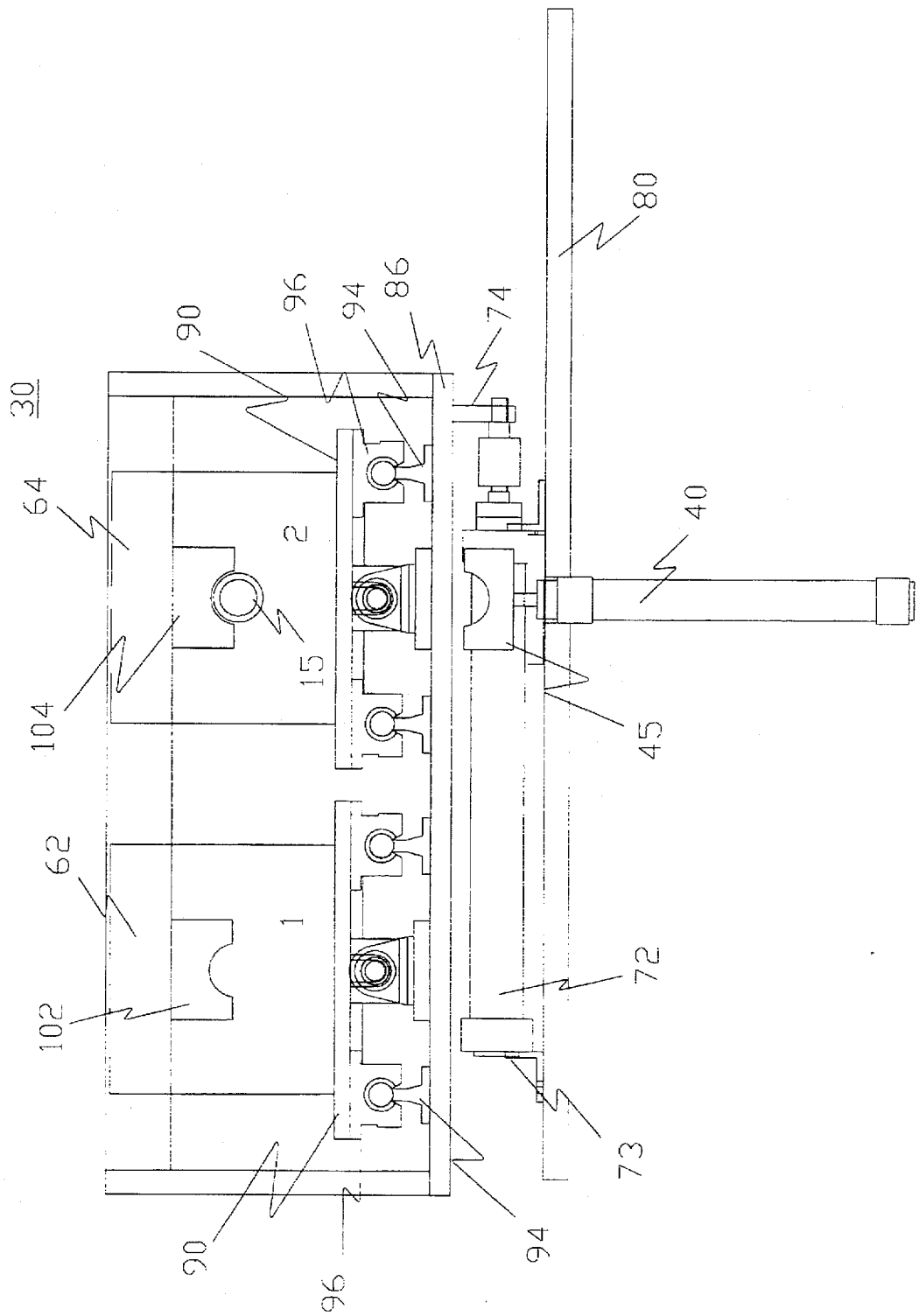
FIG. 4 is an front elevational view of the dual testing station shown in FIG. 3.
Figure 5:
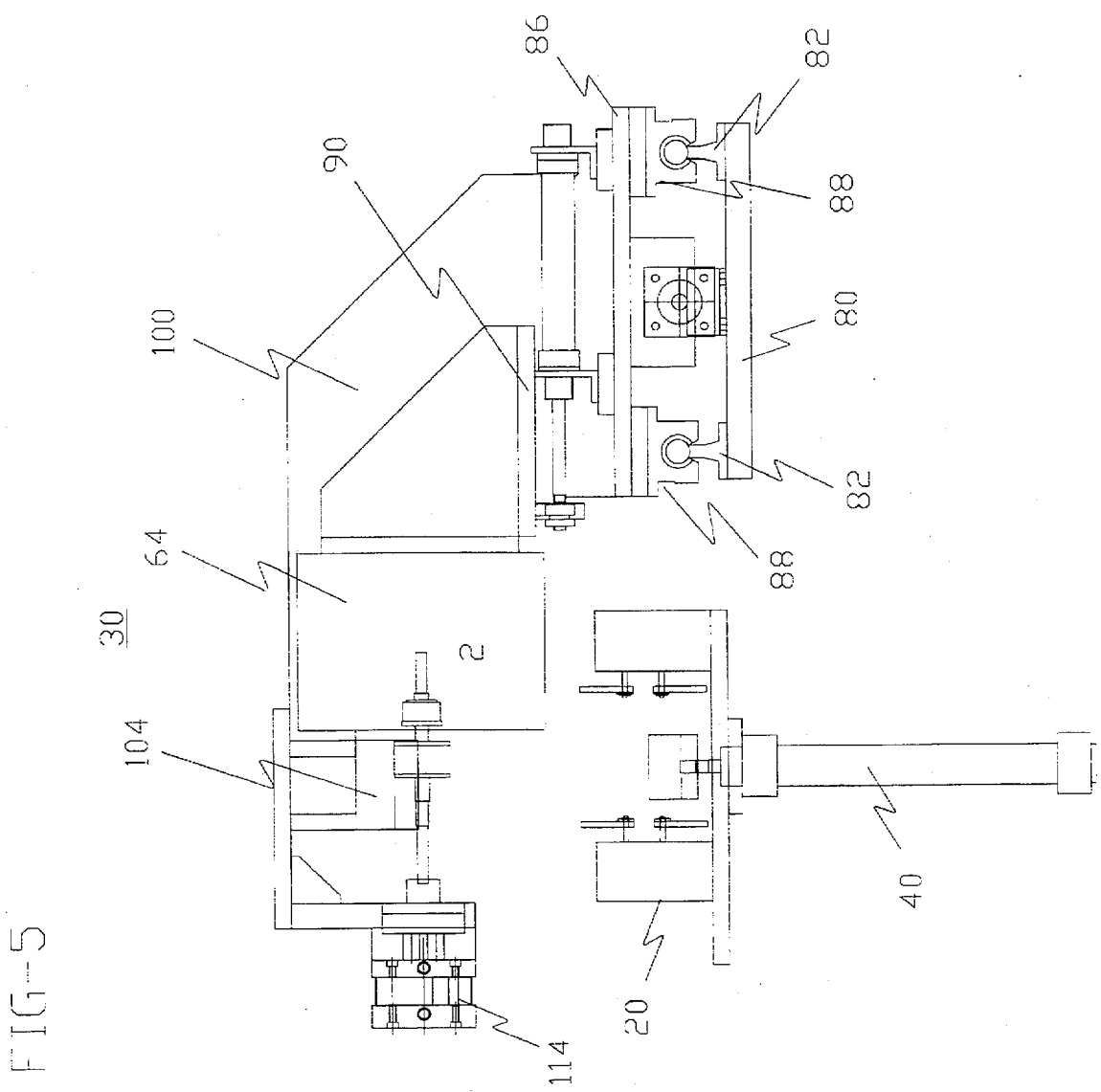
FIG. 5 is a right side elevational view of the dual testing station shown in FIG. 3.
Figure 6:
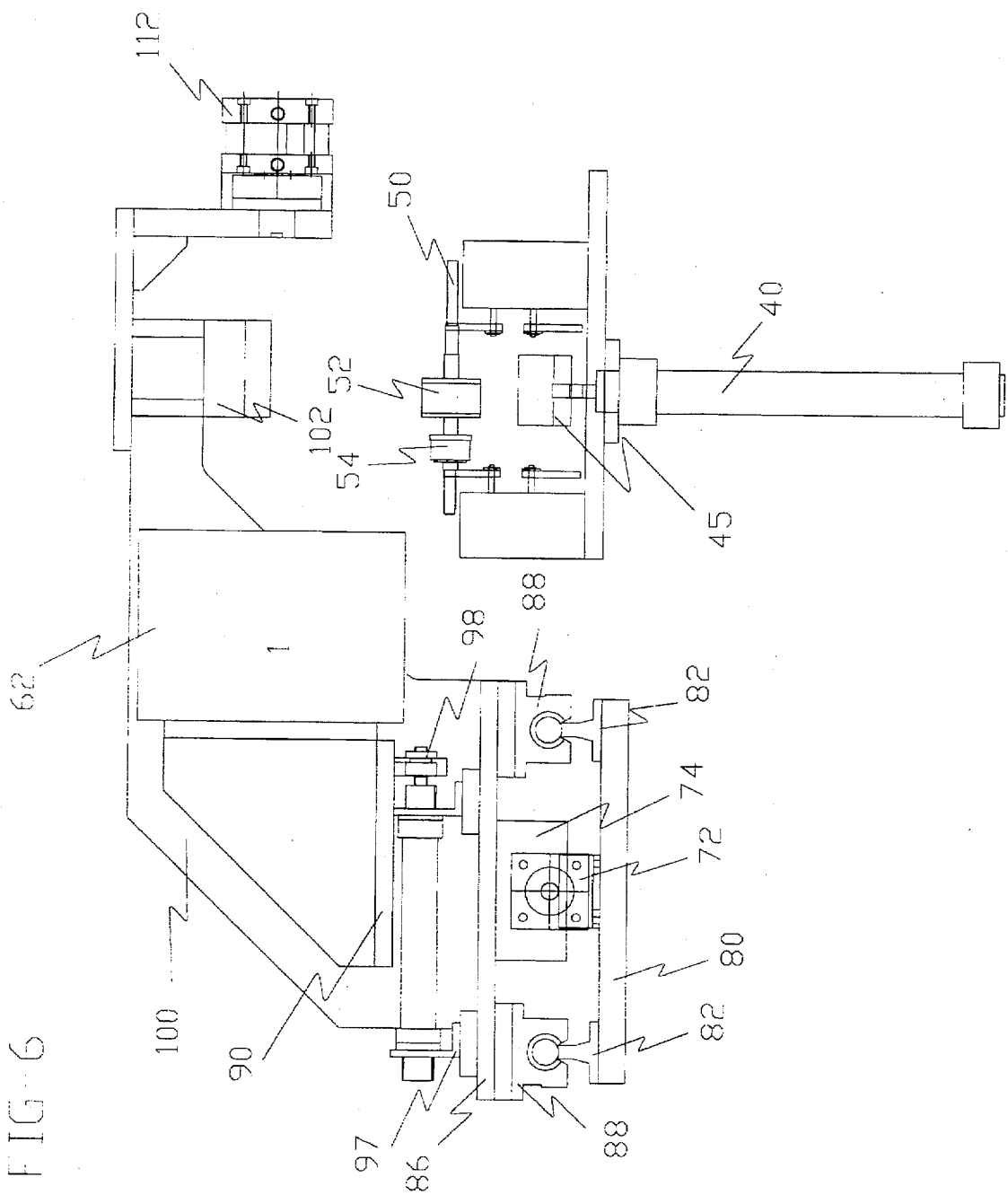
FIG. 6 is a left side elevational view of the dual testing station shown in FIG. 3.

Turning now to FIGS. 3 to 5, the support frame 60 includes a fixed, horizontally disposed, base plate 80, which is provided with a pair of rails 82 aligned parallel to the conveyor 20. A movable plate 86 is supported for horizontal movement on the rails 82 by bearings 88. The cylinder 72 has one end thereof secured to the base plate 80, and its movable piston is secured to the movable plate 86. Stops are provided to position the movable plate 86 with either Test Head #1 or Test Head #2 above the armature lifting cylinder 40.

Each test head is mounted on a movable plate 90 for movement in a direction perpendicular to the conveyor 20. Each plate 90 is supported on a pair of rails 94 mounted on plate 86 by bearings 96. Cross travel cylinders 74 and 76 each have one end thereof attached to plate 86 and the other end thereof attached to plates 90.

The test heads 62 and 64 are conventional armature testing devices that include pins that extend into contact with the bars of the armature commutator for the purpose of measuring the electrical characteristics of the armature windings.

An upper frame 100 is mounted to the plate 86 and moves therewith. A pair of upper saddles 102 and 104 are attached to the frame 100 and are placed to receive and to position an armature when the armature is lifted by the lifting cylinder 40. Also, a pair of shaft stop cylinders 112 and 114 will engage the outer end of the armatures to provide support thereto while allowing rotation of the armatures during the testing operation.

The sequence of operations for a typical operation will be described in connection with FIG. 7A, which shows the testing station 30 in the right hand position, both test stations 62 and 64 are extended and each contains an armature. In this example, the armature in Test Head #1 (62) has been tested and the armature in Test Head #2 (64) is being tested. Test Head #1 is directly above the lift cylinder 40. At this time, the test pins in Test Head #1 will be retracted away from the armature commutator, the lift cylinder 40 will be extended to the position shown, which places the saddle 45 immediately below the tested armature. Test Head #1 will then be retracted to the rear and the shaft stop cylinder 112 will also be retracted so that the armature is free to be lowered. In some installations, an ejection device may be employed to insure that the armature is free of the test head mechanism and is free to be lowered.

In FIG. 7B, the lift cylinder is lowered or retracted to place the armature on a carrier on the conveyer 20. In its lowermost position, the saddle 45 on the lift cylinder is clear of the armature and below the conveyor. At this time, the conveyor is indexed to the next position, bringing an untested armature into position immediately below Test Head #1.

Figure 7C:
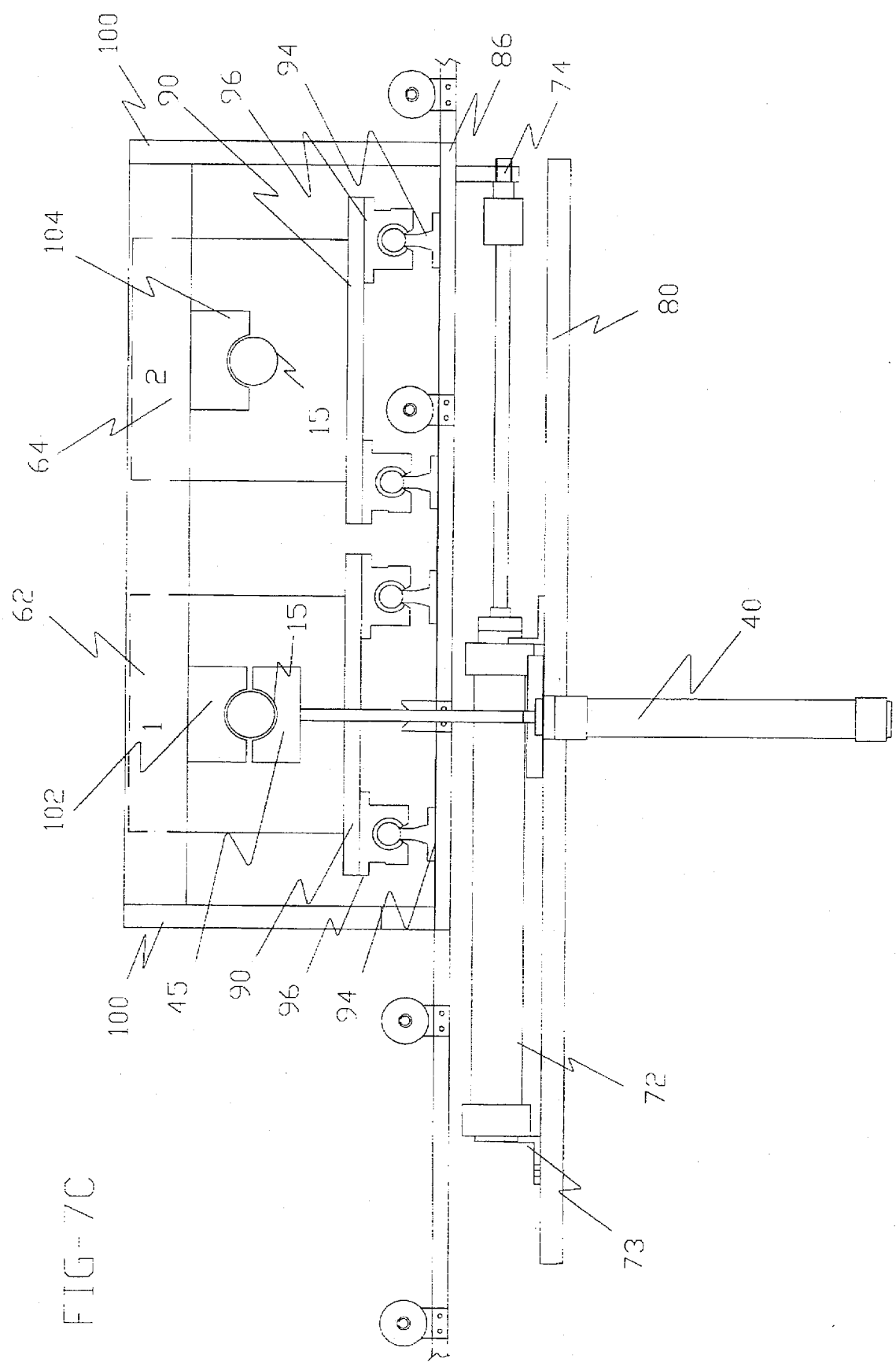

As shown in FIG. 7C, the lift cylinder 40 is again extended with an untested armature contained in its saddle 45, and that armature is placed in position for testing. At this time, the shaft stop cylinder 112 and Test Head #1 are extended to capture the armature. The test pins in the Test Head are extended to contact the armature commutator bars. With the armature captured, the lift cylinder 40 is retracted and testing of the new armature in Test Head #1 can commence.

FIG. 7D shows the lift cylinder retracted, and while the armature in Test Head #1 is being tested, the cross travel cylinder 72 has been activated and the testing station 30 has been moved to the left, thus placing Test Head #2 directly above the lift cylinder 40.

Upon completion of the testing of the armature in Test Head #2, the test pins are retracted and the lift cylinder 40 is raised to the position shown in FIG. 7E. Test Head #2 is retracted, as is the shaft stop cylinder 114, thus allowing the armature to rest in the saddle 45. The lift cylinder is lowered to the position shown in FIG. 7F where the tested armature is replaced on the conveyor 20 at which time the conveyor is indexed to position an untested armature directly above the lift cylinder preparatory to being lifted into Test Head #2.

Figure 8:
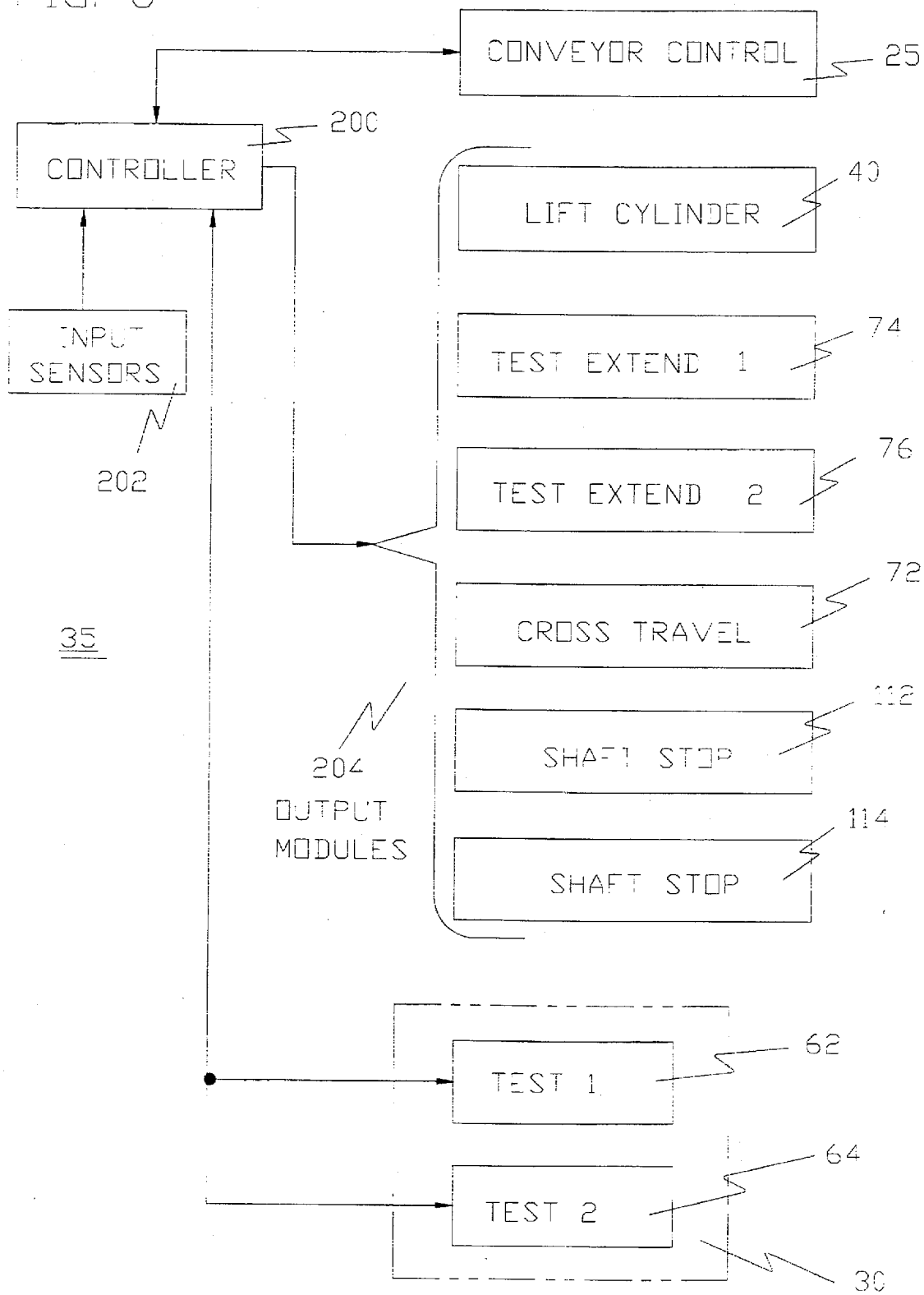
FIG. 8 is a simplified electrical block diagram of the invention.

Referring now to FIG. 8, which is a simplified block diagram showing some of the various elements that comprise the test console of the present invention, the test console 35 includes a controller 200, also referred to as a programmable logic controller, which is provided with inputs from a plurality of input sensors 202, and which, in turn, provides several outputs to a plurality of output modules, generally indicated at 204, and to the conveyor control module 25. The controller also provides control signals to the test heads 62 and 64

The input sensors 202 include conventional infrared and proximity sensors whose purpose is to determining whether an armature has been placed on the conveyor or whether the armature is present at a particular place on the conveyor. The output modules 204 include controls for the lift cylinder 40, the test head extend cylinders 74 and 76, the cross travel cylinder 72, and the shaft stop cylinders 112 and 114.

Referring now to the simplified computer software flow chart depicted in FIGS. 9A–9C, block 206, Start, represents the initial application of electric or alternating current power to the test console 35 (FIGS. 1 and 8). In block 208, PLC/Sensor Enable, power is applied to the controller 200 as well as to the input sensors 202 (FIG. 8). At this time, however, no power is applied to the output modules 204 (FIG. 8).

The Control Panel, block 210, has two outputs: 211 represents a condition when a test power switch is turned off, at which time the functions in block 212, Clear Function Test Enable and Reset Head, are performed, and the system stopped at 213; on the other hand, output 214 represents a condition when the test power switch is turned on, a signal on line 214 is applied to block 216, Chain Index/Move Pallet When Part at Start, which determines whether an armature has been placed in the starting position on the conveyor, typically three stations upstream of the testing station 30.

When an input sensor at station 26 (FIG. 1) detects an armature, a signal is applied to the conveyor control module 25 and the conveyor is indexed by one station. This places the armature two stations ahead of the testing station 30, at station 27, and with an armature detected at that station, the functions of block 222, Part @ Hi-Pot, Start Hi-Pot Test, are performed.

Within the test console, block 224, Start Hi-Pot Test, represents the performance of this test. When the test is completed, block 226, Complete Hi-Pot Test, will indicated to block 228 that the armature has successfully passed the high potential test, and block 228, Chain Index/Move Pallet to Left Station, will instruct the conveyor to move the armature to the testing station and position it above the lift cylinder 40.

The block 230, Load Head #1 Start Function Test, is the next function performed. This causes block 232 Start Function Test, to initiate the testing sequence, as explained in connection with FIG. 7. The armature is tested at this time in a conventional manner.

If no armature is found in the Hi-Pot test station 27 (FIG. 1) upstream of the testing station 30, then an output from block 236 (FIG. 9B) will be sent to block 238, Unload Head #1, and the test console, at block 240, preform a Function Test Complete/Fail Hi-Pot Fail operation. On the other hand, if an armature is in test station 27 upstream of test station 30, then the function of block 242, Chain Index/Move Pallet Carriage Right to Head #2, will be initiated. Once an armature is in place over the lift cylinder 40, then the function of block 244, Load Head #2 Start Function Test, will be actuated, with the function of block 246, Start Function Test, being performed.

Block 250, Function Test Complete/Fail HI-Pot Fail, indicates when the test has been completed, and a signal is applied to block 252, Carriage Lift and Unload Head #1, at which time an armature is removed from the Test Head and returned to the conveyor, and a signal is sent on line 254 to decision block 260, Part at Hi-Pot, FIG. 9C. This will indicate whether another armature is ready for testing. If not, then the procedures explained above in connection with block 262, Carriage Right and Unload Head #2, block 240 are performed.

If a part is present, then process proceeds to block 268, Chain Index/Move Pallet, Load Head #1, Start Test. Again, a test is performed on the armature, block 246, and at the completion of the test, block 250, the function of block 272, Carriage Right and Unload Head #2, is performed.

Decision block 276, Part @ Hi-Pot, determines how the operation is to proceed. If no armature is present, then the function of block 278 is performed, after the test represented in block 240 is completed, and the operation is returned to point "A", 220, in FIG. 9A. If an armature is present, then the operation proceeds to block 282, Chain Index/Move Pallet, Load Head #2, Start Test, and the function test of block 246 is performed. The procedure is returned to point "B", 248, where it proceeds as indicated above.

Thus, as long as armatures are loaded at station 26 (FIG. 1), they will be moved to station 27 where a conventional high potential test is performed, then the armatures are moved into test station 30, where they will be tested either by Test Head #1 or Test Head #2, then returned to the conveyor and moved down the line. Since the time required to perform the high potential test at station 27 is less than the indexing time of the conveyor, no time is lost performing this test. By using two test heads at station 30, the test performed at this station is also accomplished in less time than the normal indexing rate of the conveyor; thus, no time is lost as a result of the testing procedure.

While the form of apparatus herein described constitutes a preferred embodiment of this invention, it is to be understood that the invention is not limited to this precise form of apparatus and that changes may be made therein without departing from the scope of the invention, which is defined in the appended claims.

What is claimed is:

1. Apparatus for processing components as they move incrementally on a conveyor, said apparatus including a pair of processing stations movable in parallel with the movement of the conveyor, means for transferring a component between the conveyor and one of said processing stations, means for processing one component in one of said processing stations while another component is either being loaded into or removed from the other processing station, and means for moving said processing stations parallel to the direction of movement of the conveyor to permit a component to be loaded or unloaded.

2. Apparatus for electrically testing components as they move incrementally on a conveyor, said apparatus including a first and second testing stations for testing a component, a component lift located at a fixed position relative to the conveyor for transferring a component between the conveyor and one of said testing stations, a reciprocating mechanism supporting said first and second testing stations above the conveyor, said reciprocating mechanism movable in parallel with the movement of the conveyor and provided with a positioning device for selectively placing either said first or said second testing station above said component lift, and a control circuit for controlling the sequence of operation of said testing stations, said component lift and said reciprocating mechanism whereby a component is tested on one of said testing stations while another component is either being loaded into or removed from the other testing station.

3. Method of electrically testing components as they move incrementally on a conveyor, including the steps of providing a first and second testing stations for testing a component, moving said first and second testing stations above the conveyor in a direction parallel with the movement of the conveyor and positioning one of said testing stations above a fixed position on said conveyor, moving a component between said conveyor fixed position and one of said testing stations while another component is being tested.

4. A method for processing components as they move incrementally on a conveyor, said method including the steps of a. at a single conveyor location, transferring a component from the conveyor to one of a pair of processing stations that are movable relative to the single conveyor location, b. processing the component in one of said processing stations while the conveyor increments to its next position, c. moving the other of said processing station to a position above said single location, d. unloading a previously processed component from the other processing station, e. incrementing said conveyor by one step, f. loading an unprocessed component into said other processing station, and g. repeating steps b–f above.

* * * * *